(12) United States Patent
Schrögmeier et al.

(10) Patent No.: US 6,256,219 B1
(45) Date of Patent: Jul. 3, 2001

(54) INTEGRATED MEMORY HAVING MEMORY CELLS DISPOSED AT CROSSOVER POINTS OF WORD LINES AND BIT LINES

(75) Inventors: Peter Schrögmeier, München; Stefan Dietrich, Türkenfeld; Sabine Schöniger, Miesbach; Christian Weis, München, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/589,439

(22) Filed: Jun. 7, 2000

(30) Foreign Application Priority Data

Jun. 7, 1999 (DE) ............................................. 199 25 881

(51) Int. Cl.$^7$ ................................ G11C 5/06; G11C 8/00
(52) U.S. Cl. ........................................ 365/63; 365/230.06
(58) Field of Search .............................. 365/63, 149, 207, 365/230.03, 230.06

(56) References Cited

U.S. PATENT DOCUMENTS

| | | | |
|---|---|---|---|
| 5,687,125 | * 11/1997 | Kikuchi | 365/200 |
| 5,822,268 | * 10/1998 | Kirihata | 365/230.03 |
| 5,930,194 | * 7/1999 | Yamagata et al. | 365/230.03 |
| 6,134,154 | * 10/2000 | Iwaki et al. | 365/189.04 |
| 6,163,496 | * 12/2000 | Sasaki et al. | 365/230.03 |

* cited by examiner

Primary Examiner—Richard Elms
Assistant Examiner—Anh Phung
(74) Attorney, Agent, or Firm—Herbert L. Lerner; Laurence A. Greenberg; Werner H. Stemer

(57) ABSTRACT

An integrated memory has first control lines, which run in the direction of bit lines, and a second control line, which runs in the direction of word lines. First control inputs of in each case at least two switching elements that are connected to different sense amplifiers are connected to the same first control line. The second control inputs of the switching elements are connected to the second control line. The invention makes it possible to reduce the number of first control lines running in the direction of the bit lines.

2 Claims, 2 Drawing Sheets

CADR = A0...A7

INTEGRATED MEMORY HAVING MEMORY CELLS DISPOSED AT CROSSOVER POINTS OF WORD LINES AND BIT LINES

BACKGROUND OF THE INVENTION

Field of the Invention

The invention relates to an integrated memory having memory cells disposed at crossover points of word lines and bit lines.

Memories of this type include a type known as dynamic random access memories (DRAMs). The latter have sense amplifiers for amplifying data read out onto the bit lines, which are connected via switches to data lines, via which they output the amplified data to a point outside the memory. In this case, the memory cells to be addressed are selected by use of word addresses and column addresses. The word addresses serve for the selection of one of the word lines and the column addresses for the selection of at least one of the bit lines. To that end, a DRAM has a word decoder, whose outputs are connected to the word lines, and a column decoder, whose outputs are connected via column select lines to control inputs of the switches, via which the sense amplifiers are connected to the data lines. In this case, the column select lines usually run parallel to the bit lines. This is advantageous for example when a column decoder is simultaneously assigned to a plurality of memory blocks, with the result that each column select line in a plurality of the memory blocks which are adjacent in the direction of the bit lines are connected to control inputs of the switches.

Under certain circumstances, the number of column select lines may rise in such a way that it becomes problematic to accommodate them on the area that is available. This is the case, for example, when although memory blocks which are adjacent to one another in the direction of the bit lines have a common column decoder which is disposed in the direction of the bit lines at one end of the adjacent memory blocks, this common column decoder nevertheless supplies different column select signals for each of the memory blocks, which signals also have to be transmitted via different column select lines to the blocks. This is the case for example with synchronous DRAMs having a plurality of banks, where the intention is to implement so-called "bank ping-pong" (fast alternate access to a plurality of already activated memory banks). In memories of this type, the number of column select lines increases by a factor that is equal to the number of banks which share a common column decoder.

There is a minimum distance that can be achieved between the column select lines, which distance depends on the fabrication technology used. If the number of column select lines is too large, the area that is necessary for realizing the memory is no longer determined by the size of the memory cells, but by the number of column select lines.

SUMMARY OF THE INVENTION

It is accordingly an object of the invention to provide an integrated memory having memory cells disposed at crossover points of word lines and bit lines that overcomes the above-mentioned disadvantages of the prior art devices of this general type, in which the area which is required for the column select lines running in the bit line direction is reduced.

With the foregoing and other objects in view there is provided, in accordance with the invention, an integrated memory, including:

bit lines;

word lines intersecting the bit lines;

memory cells disposed at crossover points of the bit lines and the word lines;

sense amplifiers connected to the bit lines for amplifying signals on the bit lines;

switching elements each having a first control input and a second control input, the switching elements are connected to the sense amplifiers;

a data line connected to the switching elements and connected through the switching element to the sense amplifiers;

first control lines running in a direction of the bit lines, the first control input of in each case two of the switching elements, which are connected to different ones of the sense amplifiers, are connected to a same one of the first control lines, and the two of the switching elements connected to the same one of the first control lines only one being electrically conductive simultaneously in a manner dependent on potentials at the second control input of each of the two of the switching elements; and at least one second control line running in a direction of the word lines and connected to the second control input of the switching elements.

In the case of the memory according to the invention, the selection of the switching elements which connect the sense amplifiers to the data line is effected in a manner dependent on the first control lines, which run in the direction of the bit lines, and at least one second control line, which runs in the direction of the word lines. The effect advantageously achieved in this way is that the number of first control lines running in the direction of the bit lines can be reduced, thereby reducing the space that they require. In contrast, the additional presence of the second control lines running in the direction of the word lines does not constitute a significant increase in the space requirement.

According to a development of the invention, the potential of the second control lines is dependent on a bit of a column address that can be fed to the memory and serves for addressing the bit lines. Furthermore, according to the development, the integrated memory has a column decoder, to which the remaining bits of the column address are fed as a partial address and whose outputs are connected to the first control lines.

Other features which are considered as characteristic for the invention are set forth in the appended claims.

Although the invention is illustrated and described herein as embodied in an integrated memory having memory cells disposed at crossover points of word lines and bit lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
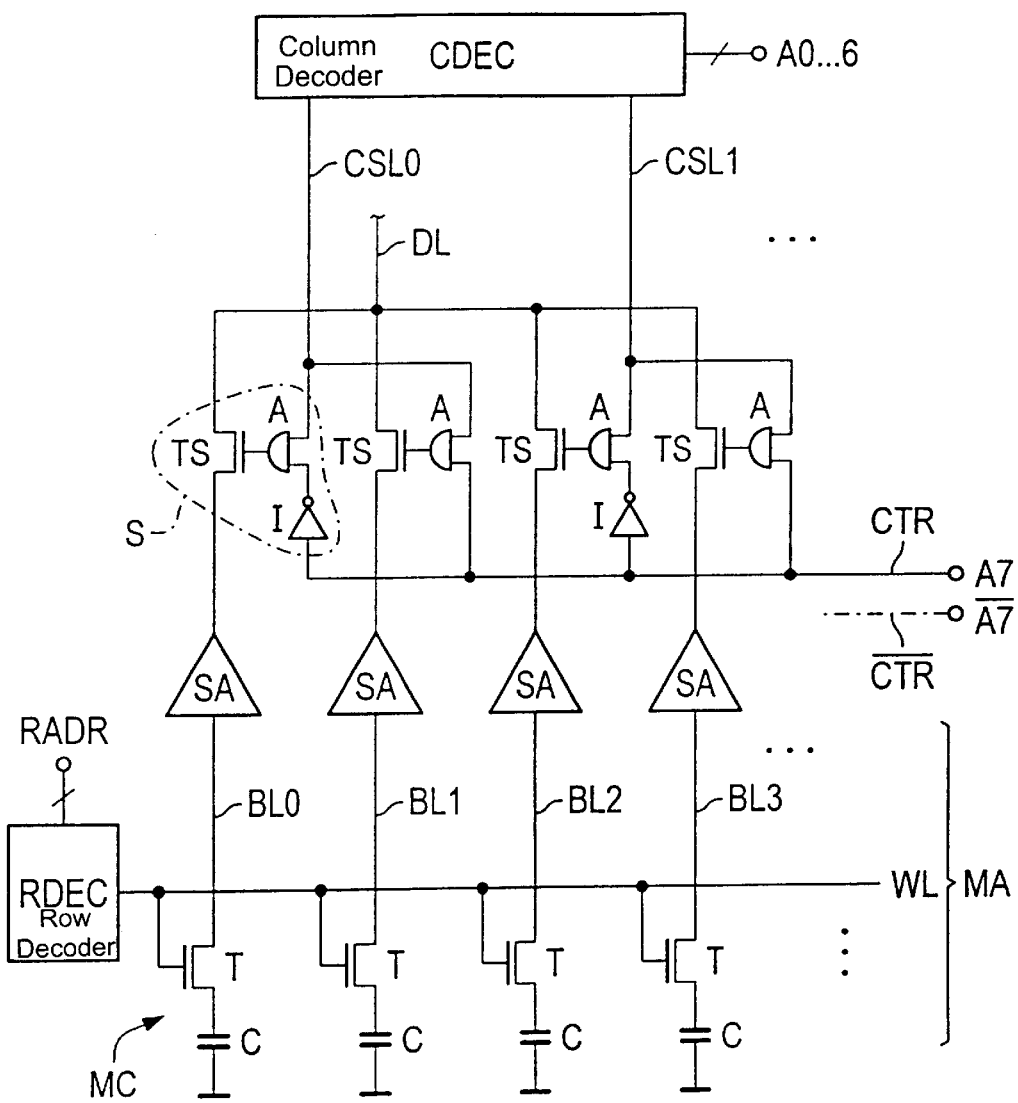
FIG. 1 is a block circuit diagram of a detail of an exemplary embodiment of a memory according to the invention.

In all the figures of the drawing, sub-features and integral parts that correspond to one another bear the same reference symbol in each case. Referring now to the figures of the drawing in detail and first, particularly, to FIG. 1 thereof, there is shown a memory having memory cells MC of a 1-transistor/1-capacitor type which are disposed at crossover points of bit lines BLi and word lines WL. The memory cells MC are disposed in a memory cell array or memory block MA. Only four of the bit lines Bli and one of the word lines WL have been illustrated in FIG. 1, for reasons of clarity. The bit lines BLi are connected via sense amplifiers SA and switching transistors TS to a data line DL, via which data can be transmitted from outside the memory to the memory cells MC or in the opposite direction. The switching transistors TS form parts of switching elements S which, furthermore, each have an AND gate A and, if appropriate, an inverter I. In the case of the switching elements S which have the inverter I, one input of the AND gate A forms a first control input of the switching element S and an input of the inverter I forms a second control input. In the case of the remaining switching elements S, the other input of the AND gate A forms the second control input.

For the selection of the word lines WL, the memory in FIG. 1 has a row decoder RDEC, whose inputs are connected to row addresses RADR and whose outputs are connected to in each case one of the word lines WL. For the selection of the bit lines BLi, the memory has a column decoder CDEC, whose inputs are connected to seven bits A0 to A6 of a column address that can be fed to the memory, and whose outputs are connected to column select lines CSLi. Each column select line CSLi is connected to the first control inputs of in each case two of the switching elements S, in each case one of which has one of the inverters I. The column select lines CSLI are first control lines of the memory, which run parallel to the bit lines.

The memory furthermore has a second control line CTR for the selection of the bit lines BLi, which second control line CTR runs parallel to the word lines WL and is connected to the second control inputs of all the switching elements S. The second control line CTR serves for feeding in an eighth address bit A7 of the column address CADR.

It is pointed out that, in conventional DRAMs, differential sense amplifiers SA are usually used, which are connected to pairs of the bit lines BLi, on the one hand, and to pairs of the data lines DL, on the other hand, only in each case one bit line BLi connected to each sense amplifier SA and one data line DL have been illustrated in FIG. 1, for reasons of clarity. It goes without saying, however, that the invention can also be applied to the memories mentioned, in which case each of the switching elements S must then have two switching transistors TS in order to transmit the differential data signals.

Moreover, it is usual for more than one bit line BLi to be selected with each column address, which bit lines are connected to different data lines via a respective sense amplifier SA. The invention can also be applied to memories of this type, in which case the switching elements S must then contain a correspondingly higher number of switching transistors TS which are driven via the output signal of the associated AND gate A.

The AND gates A and the inverters I of the switching elements S in FIG. 1 form a final stage of the column decoding of the memory. The column decoder CDEC contains upstream decoder stages which perform a selection of one of the column select lines CSLI in a manner dependent on the partial address formed by the first seven address bits A0 to A6 of the column address CADR. The signals transmitted via the column select lines CSLi are thus, as it were, predecoded addresses. By use of the AND gates A and the inverters I, a selection of the switching transistors TS to be activated is then effected with evaluation of the predecoded addresses and of the eighth address bit A7 of the column address CADR, which bit is fed via the second control line CTR. If, by way of example, the first column select line CSL0 is brought to a high level by the first seven addresses A0 to A6, while the rest of the column select lines remain at a low level, that switching transistor TS which connects the second bit line BL1 to the data line DL is turned on, provided that the eighth address bit A7 has a high level. If, by contrast, the eighth address bit has a low level, the first bit line BL0 is conductively connected to the data line DL via its sense amplifier SA and its switching transistor TS.

Since, in the case of the exemplary embodiment illustrated in FIG. 1, each column select line CSLi is assigned to two of the switching elements S, which are in turn differentiated by the eighth address bit A7 of the column address CADR, which bit is transmitted via the second control line CTR, the number of column select lines CSLi is half as large as if each of the switching elements S were assigned a dedicated column select line CSLi running in the direction of the bit lines. Therefore, while the number of column select lines CSLi is halved, the area required for the second control line CTR, the AND gate A and also the inverter I is relatively small.

FIG. 1 indicates a further exemplary embodiment of the memory according to the invention, which has a further second control line/CTR for feeding in the inverted eighth address bit A7, which control line likewise runs parallel to the word lines WL. The inverters I can be omitted in this exemplary embodiment. The corresponding inputs of the affected AND gates A are then connected to the further second control line/CTR, while only those switching elements S which do not have an inverter I in the exemplary embodiment outlined previously are connected to the second control line CTR. The method of operation of this exemplary embodiment corresponds precisely to that of the exemplary embodiment outlined previously.

Figure 2:
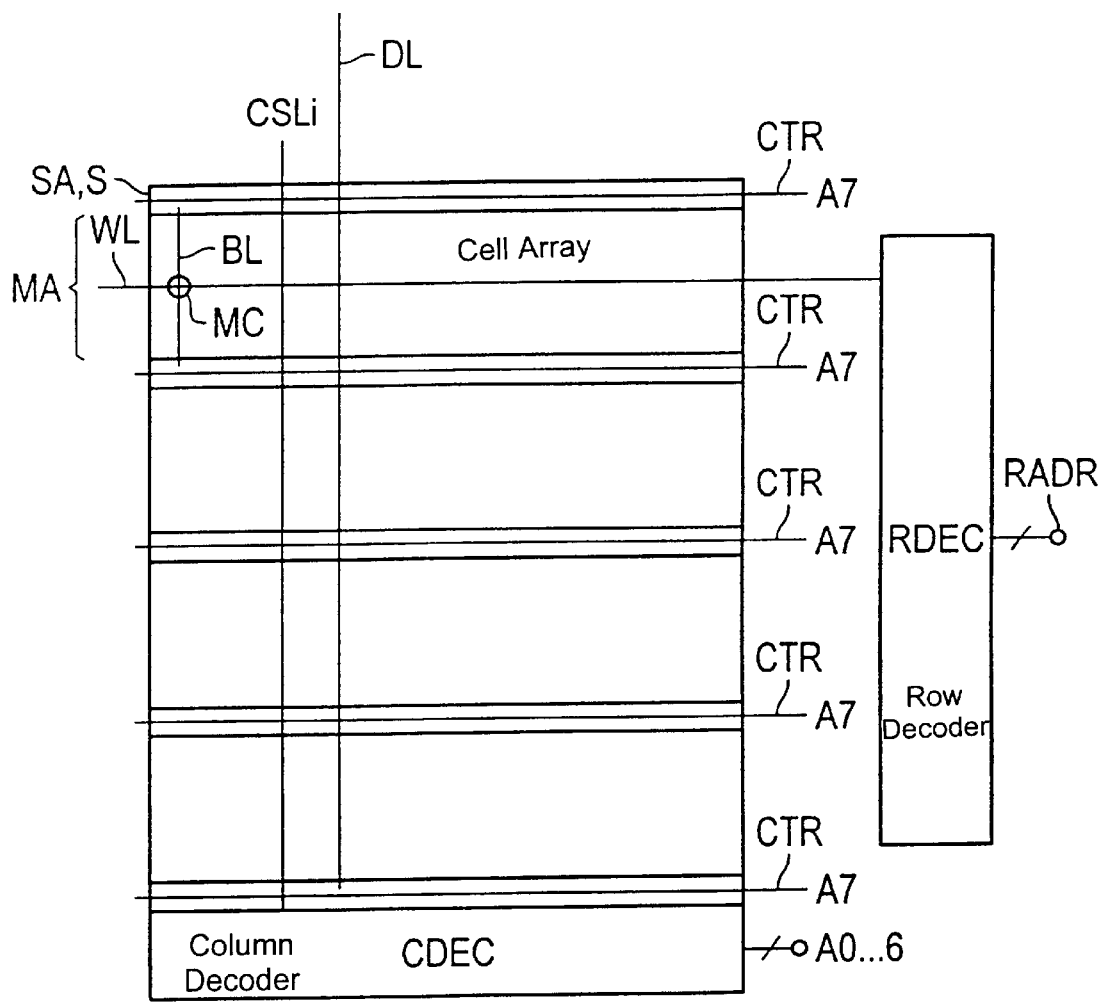
FIG. 2 is a block diagram of a detail of the memory shown in FIG. 1.

FIG. 2 shows a larger detail of the memory from FIG. 1. The column decoder CDEC is disposed on one side of four cell arrays MA which are disposed adjacent to one another in the direction of the bit lines. The cell arrays MA are separated from one another by strips in which the sense amplifiers SA and the switching elements S are disposed. In this exemplary embodiment, the column select lines CSLi connected to the outputs of the column decoder CDEC are connected to the switching elements S of each of the cell arrays MA. A second control line CTR of the type explained with regard to FIG. 1 runs in each of the strips having the switching elements S. In each case one of the word lines WL in one of the cell arrays MA is activated via the row decoder RDEC.

We claim:
1. An integrated memory, comprising:
bit lines;
word lines intersecting said bit lines;
memory cells disposed at crossover points of said bit lines and said word lines;
sense amplifiers connected to said bit lines for amplifying signals on said bit lines;
switching elements each having a first control input and a second control input, said switching elements connected to said sense amplifiers;

a data line connected to said switching elements and connected through said switching element to said sense amplifiers;

first control lines running in a direction of said bit lines, said first control input of in each case two of said switching elements connected to different ones of said sense amplifiers being connected to a same one of said first control lines, and said two of said switching elements connected to the same one of said first control lines only one being electrically conductive simultaneously in a manner dependent on potentials at said second control input of each of said two of said switching elements; and at least one second control line running in a direction of said word lines and connected to said second control input of said switching elements.

2. The integrated memory according to claim 1, wherein a potential of said at least one second control line is dependent on a bit of a received column address, and including a column decoder receiving other bits of the received column address as a partial address and said column decoder having outputs connected to said first control lines.

* * * * *